United States Patent
Jeng

[11] Patent Number: 5,821,621
[45] Date of Patent: Oct. 13, 1998

[54] LOW CAPACITANCE INTERCONNECT STRUCTURE FOR INTEGRATED CIRCUITS

[75] Inventor: Shin-Puu Jeng, Plano, Tex.

[73] Assignee: Texas Instruments Incorporated, Dallas, Tex.

[21] Appl. No.: 728,879

[22] Filed: Oct. 10, 1996

Related U.S. Application Data

[60] Provisional application No. 60/005,132 Oct. 12, 1995.
[51] Int. Cl.[6] .................................................. H01L 23/532
[52] U.S. Cl. .......................... 257/759; 257/760; 257/758; 438/623
[58] Field of Search .................................... 438/623, 626, 438/631; 257/759, 760, 758

[56] References Cited

U.S. PATENT DOCUMENTS

| | | |
|---|---|---|
| 5,354,713 | 10/1994 | Kim et al. . |
| 5,486,493 | 1/1996 | Jeng . |
| 5,527,737 | 6/1996 | Jeng . |
| 5,547,786 | 8/1996 | Jones et al. . |
| 5,591,677 | 1/1997 | Jeng . |
| 5,635,428 | 6/1997 | Martin et al. . |

*Primary Examiner*—Caridad Everhart
*Attorney, Agent, or Firm*—Bret J. Petersen; James C. Kesterson; Richard L. Donaldson

[57] ABSTRACT

An improved method is provided for integrating polymer and other low dielectric constant materials, which may have undesirable physical properties into integrated circuit structures and processes, especially those requiring multiple levels of interconnect lines. The present invention combines the advantages of $SiO_2$ with low dielectric constant materials by placing the low dielectric material only between tightly spaced lines. In a preferred embodiment, a low-k material is spun across the surface of the wafer to fill areas between all interconnect lines. The critical areas, or those where the low-k material is to remain are masked off with resist. The low dielectric constant material in non-critical or widely spaced areas is then etched away, leaving the problematic but desirable low-k material in those areas where needed. A layer of dielectric such as $SiO_2$ can then be applied to fill the remaining areas and provide spacing between metal layers. After planarization, the process steps can be repeated for multiple interconnect layers.

13 Claims, 2 Drawing Sheets

LOW CAPACITANCE INTERCONNECT STRUCTURE FOR INTEGRATED CIRCUITS

This application claims priorty under 35 U.S.C. §119(e)(1) of provisional application number 60/005,132, filed Oct. 12, 1995.

FIELD OF THE INVENTION

This invention generally relates to interconnections in integrated circuits. More particularly, it relates to a method of manufacture and a structure for reducing capacitance on closely spaced interconnect lines of an integrated circuit.

BACKGROUND OF THE INVENTION

Integrated circuits have continued to shrink in size and increase in complexity with each new generation of devices. As a result, integrated circuits increasingly require very close spacing of interconnect lines and many now require multiple levels of metalization, as many as five, to interconnect the various circuits on the device. Since closer spacing increases capacitance between adjacent lines, as the device geometries shrink and densities increase capacitance and cross talk between adjacent lines becomes more of a problem. Therefore, it becomes increasingly more desirable to use lower dielectric materials to offset this trend and thereby lower capacitance between closely spaced interconnects.

Interconnect capacitance has two components: the line-to-substrate, or line-to-ground capacitance and line-line capacitance. For ultra large scale integration at 0.25 micron design rules and beyond, performance is dominated by interconnect RC delay, with line-to-line capacitance being the dominant contributor to total capacitance. For example, theoretical modeling has shown that when the width/spacing is scaled down below 0.3 micron, the interlayer capacitance is so small that total capacitance is dictated by the line-to-line capacitance, which constitutes more than 90% of the total interconnect capacitance. Therefore, a reduction of the line-line capacitance alone will provide a dramatic reduction in total capacitance.

The intermetal dielectric (IMD) of the prior art is typically $SiO_2$ which has a dielectric constant of about 4.0. It would be desirable to replace this material with a material having a lower dielectric constant. As used herein, low dielectric constant or low-k means a material having a dielectric constant of lower than 4 and preferably lower than 3 and most preferably about 2 or lower. Unfortunately, materials having a lower dielectric constant have characteristics that make them difficult to integrate into existing integrated circuit structures and processes. Many polymeric materials such as polysilsequioxane, parylene, polyimide, benzocyclobutene and amorphous TEFLON have lower dielectric constants (lower permitivities). Other preferred materials are Aerogel or Xerogel which are typically made from a gelation of tetraethyl orthosilicate stock solution. Compared to $SiO_2$, these preferred low-k materials typically have low mechanical strength, poor dimensional stability, poor temperature stability, high moisture absorption and permeation, poor adhesion, large thermal expansion coefficient and an unstable stress level. Because of these attributes, the use of polymer or other low dielectric materials as a stand alone replacement for $SiO_2$ in integrated circuit processes or structures is very difficult if not impossible.

An earlier application, by Haveman, Ser. No. 08/250,142 now abandoned, assigned to Texas Instruments Inc. and incorporated herein by reference, disclosed a two-step metal etch process for selectively filling the gaps of narrowly spaced interconnects to reduce capacitance in VLSI circuits while using a structurally sturdy interlevel dielectric in non-critical areas. The disadvantages of this method include two separate metal etches and two separate interlevel dielectric depositions.

Another application by applicant herein, Ser. No. 08/202,057, now abandoned assigned to Texas Instruments Inc. and incorporated herein by reference, disclosed a method for filling narrow gaps with low dielectric constant materials. While the methods of this application do not require an additional masking step, it does require more precise etching techniques.

SUMMARY OF THE INVENTION

In accordance with the present invention, an improved method is provided for integrating polymer and other low dielectric constant materials, which may have undesirable properties such as those discussed above, into integrated circuit structures and processes, especially those requiring multiple levels of interconnect lines. The present invention combines the advantages of $SiO_2$ and low dielectric constant materials by placing the low dielectric material only in critical areas, between those tightly spaced lines where capacitance is a problem. Since the interlayer dielectric is still mostly comprised of a traditional dielectric such as $SiO_2$, many of the problems discussed above are alleviated. Structural stability, adhesion, thermal conductivity etc. are provided by the $SiO_2$ or other suitable dielectric.

In the method of the present invention, interconnect lines are first patterned and etched. In a preferred embodiment, a low-k material is spun across the surface of the wafer to fill areas between interconnect lines. The critical areas, those narrowly spaced interconnects where the low-k material is to remain, are masked off with resist. The low-k material in non-critical and/or widely spaced areas is then etched away, leaving the problematic but desirable low-k material in those areas where needed. An intermetal dielectric layer such as $SiO_2$ can then be applied to fill the remaining areas and provide spacing between metal layers. After planarization, the process steps can be repeated for multiple interconnect layers.

This is apparently the first use of selectively incorporating low-k material between narrowly spaced lines in critical areas of device interconnects using an additional mask step to control area selection with a single interlevel dielectric deposition.

An advantage for an embodiment of this invention is the low-k material can be selectively inserted between closely spaced interconnect lines without the alignment problems associated with some previous methods.

An additional advantage of this invention is standard metal etching processes can be used and precise etching techniques may not be needed.

Another advantage for one embodiment is the interconnections may be made with a single metal etch and only a single interlevel dielectric deposition may be required.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

DETAILED DESCRIPTION OF THE PREFERRED EMBODIMENTS

The preferred embodiment of the present invention is best understood by referring to FIGS. 1–8 of the drawings, like numerals are used for like and corresponding parts of the various drawings.

Figure 1:
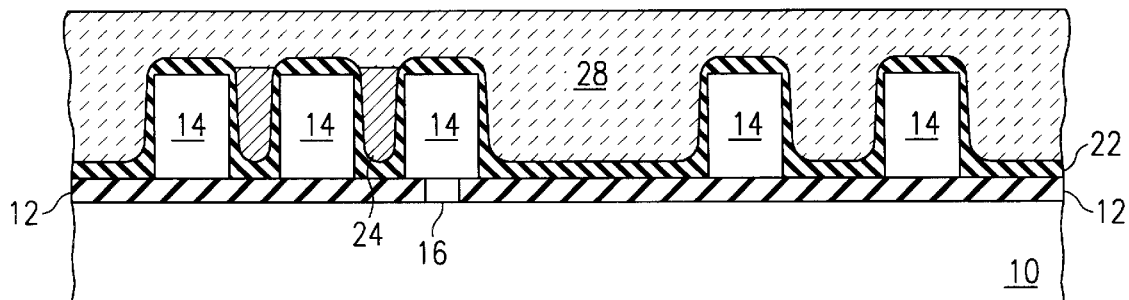
FIG. 1 Represents a cross-sectional view of a preferred embodiment of the present invention.

With reference to FIG. 1, there is shown a completed structure of an embodiment of the present invention, wherein a low-k material 24 is deposited between interconnect lines 14 in selected critical areas while non-critical or widely spaced areas are filled with a conventional dielectric to give mechanical and thermal stability, adhesion, etc. As used herein, "critical areas" are those areas where capacitance is a problem or where it is desirable to decrease the capacitance between two adjacent metal leads or interconnects. Capacitance is typically a problem where a combination of close spacing of interconnect lines and the relative high frequency of signals on those interconnect lines lead to cross-talk, signal degradation or increased drive requirements. Thus, at low frequencies a minimum lead spacing, which is the minimum spacing allowed by the process design rules, may not be critical; but at higher frequencies that same spacing becomes critical. Critical areas are therefore dependant on design consideration such as frequency of the signals, minimum design rules, tolerance to capacitance etc. Non-critical areas need not be filled, and preferably are not filled with low-k material.

Figure 2:
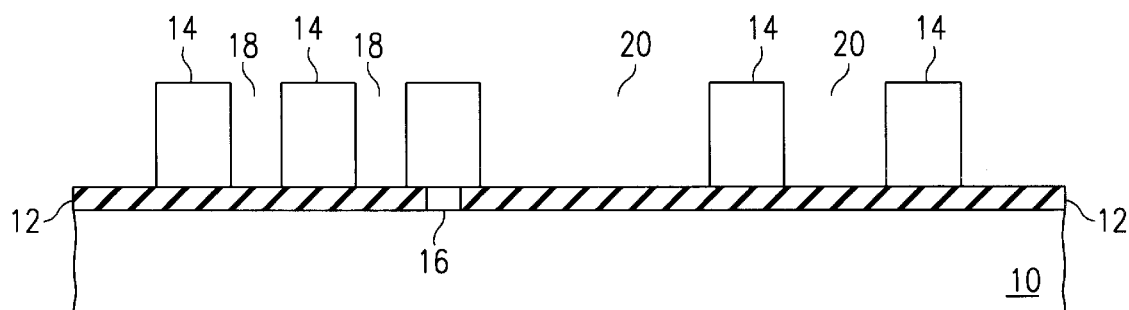
FIG. 2 Represents the cross-section of metal interconnects on a semiconductor substrate.

With reference to FIGS. 2–7, there is shown a method of forming an embodiment of the present invention which is shown in the completed structure of FIG. 1. FIG. 2 illustrates a semiconductor substrate 10 covered with a layer of dielectric 12. The illustrated embodiment of the present invention is directed to reducing capacitance between interconnections on an integrated circuit. Since these interconnections are typically located over the top of active devices fabricated on the surface of a wafer of semiconducting material such as silicon crystal, semiconductor substrate 10 will normally include several layers of various semiconductor materials which make up the active components of the semiconductor device. For simplicity, these layers and devices are not shown in the illustrations. Dielectric layer 12 may be any material suitable for insulating metal interconnect lines 14 from components or other materials in layers below and shown lumped together as semiconductor substrate 10.

Interconnect lines are preferably formed by depositing a layer of aluminum on a preferably planer dielectric layer 12. The aluminum may be masked with a resist, patterned and etched with one of several methods known in the art. This procedure results in the metal connecting lines 14 as shown in FIG. 2. The method of the present invention contemplates using high aspect ratio metal, where the thickness of the interconnect metal is greater than the width. The high aspect ratio interconnects are useful to reduce line resistance while maintaining close spacing for high density circuits. Connection between the interconnects and the circuits below is represented by the via and plug 16. The number and location of vias is determined by the underlying circuit design.

FIG. 2 illustrates critical areas 18 which are those areas between closely spaced metal interconnects 14 where capacitance is a problem, and non-critical areas 20. Non-critical areas are areas between metal interconnects which are either spaced sufficiently or for other reasons capacitance is not a problem, such as interconnects carrying low frequency signals.

Figure 3:
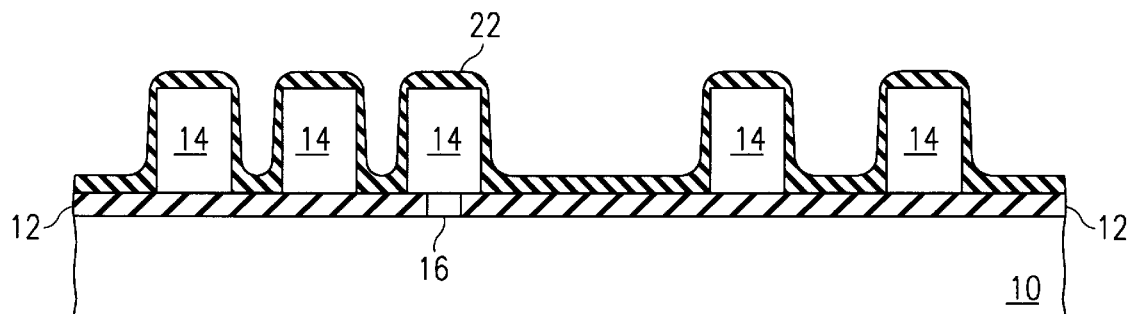
FIG. 3 Shows a liner added to the FIG. 1 structure.

FIG. 3 shows the application of a liner layer 22 over the metal interconnects and exposed surfaces of the dielectric layer. Liner layer 22 is an optional layer to protect metal interconnect lines 14 from solvents used in some spin-on low-k materials to prevent oxidation of the metal interconnect lines. Liner layer 22 can be eliminated when non-interactive dielectric materials are used, that is dielectric materials that will react with the metal layer or materials used for the via contact. Liner layer 22 is typically a thin layer, 250 Å–1,000 Å coverage on blank wafer, of plasma enhanced TEOS with about 40% step coverage.

Figure 4:
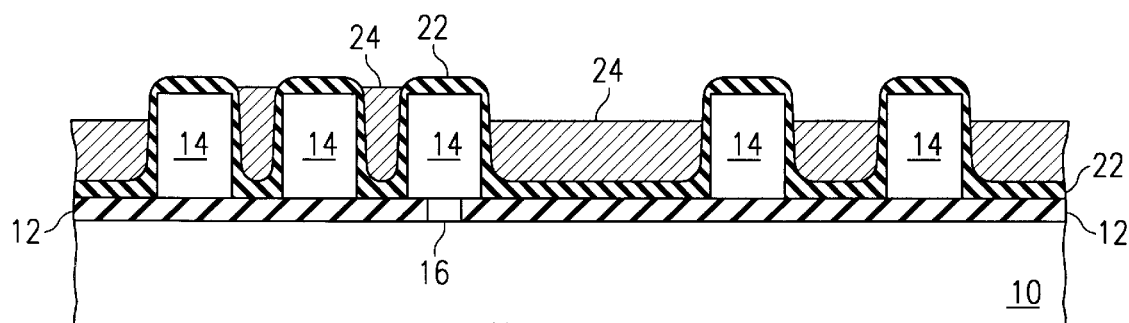
FIG. 4 Shows a low dielectric material added to the surface.

After application of a liner layer, if used, a low dielectric constant material 24 is applied on the surface of the wafer. The low-k material 24 is applied in sufficient thickness to fill critical areas 18 between the metal interconnects 14, shown in FIG. 4. In a preferred embodiment, the low-k material is applied by the spin-on method, which is where the material is dropped in a liquid form onto the spinning wafer and the material disperses across the wafer. Spin-on application typically results in the material being deposited with a varying thickness across the wafer. The thickness of the material usually will be thicker in areas where the width of the gap is narrow as shown in FIG. 4. The preferred materials are those listed in the table below, which have a dielectric constant of less than about 3, while the most preferred are porous materials such as Aerogel or Xerogel which have a dielectric constant in the range of about 1 to 2.

Figure 5:
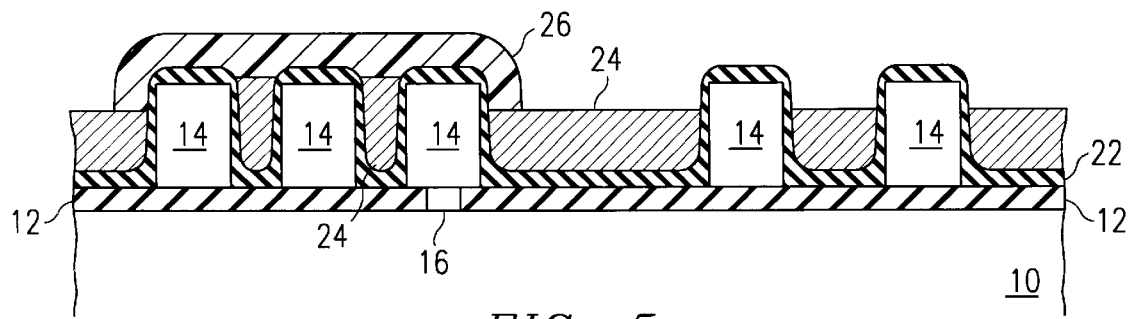
FIG. 5 Shows a resist mask applied to the areas to retain low dielectric material.

Critical areas are then masked with resist 26 as shown in FIG. 5. Critical areas are typically those where capacitance is a problem due to close spacing of interconnect lines carrying high frequency signals. Non-critical areas need not be masked, and preferably are not masked to prevent them from remaining filled with low-k material.

Figure 6:
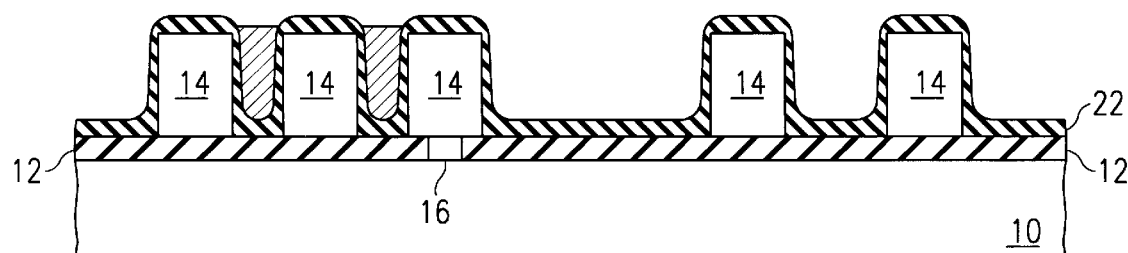
FIG. 6 Shows the structure after the unwanted low dielectric material is removed.

FIG. 6 represents a preferred embodiment after the low-k material 24 is etched from the non-critical areas 20 and the resist 26 has been removed. Etching of the low-k material can be done with either dry or wet etch processes known in the art. The use of a liner layer 22 is optional depending upon whether the low-k dielectric can be directly applied on the interconnects 14. The liner layer may be an etch stopping layer such as a low-dielectric organic spin-on-glass or silicon oxide.

Figure 7:
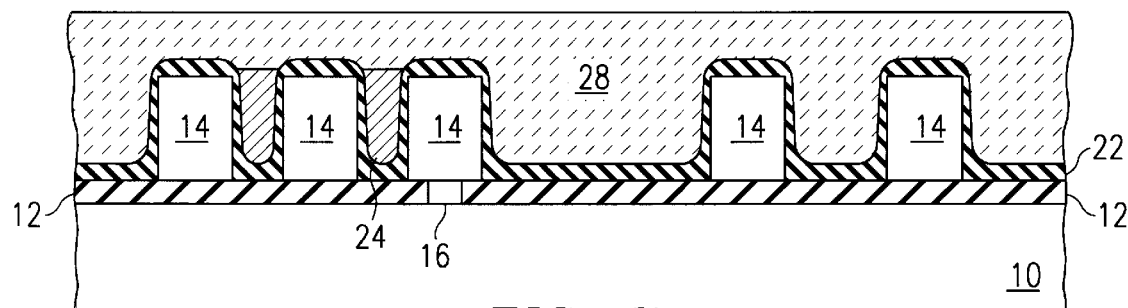
FIG. 7 Shows the complete structure after adding a dielectric layer and planarization.

After the low-k material 24 is etched from the non-critical areas 20 and the resist 26 has been removed, the interlayer dielectric layer 28 can be applied and planarized, resulting in a preferred embodiment as shown in FIG. 7. In a preferred embodiment, the interlayer dielectric is $SiO_2$ deposited by plasma enhanced chemical vapor deposition (PECVD) and planarized by chemical mechanical polishing (CMP). As has been illustrated, the present invention combines the advantages of SiO$_2$ and low dielectric constant materials by placing the low dielectric material only between tightly spaced lines or critical areas. Since the interlayer dielectric is still mostly comprised of a traditional dielectric such as SiO$_2$, many of the problems discussed above are alleviated. Structural stability, adhesion, thermal conductivity etc. are provided by the SiO$_2$ or other suitable dielectric.

The method of the present invention may be repeated to form multiple levels of interconnects stacked one upon the other. Typically this will necessitate vias and contacts from one level to the next. These vias, not shown in the figures, are usually made after the interlevel dielectric has been applied and planarized in a manner well known in the art.

Figure 8:
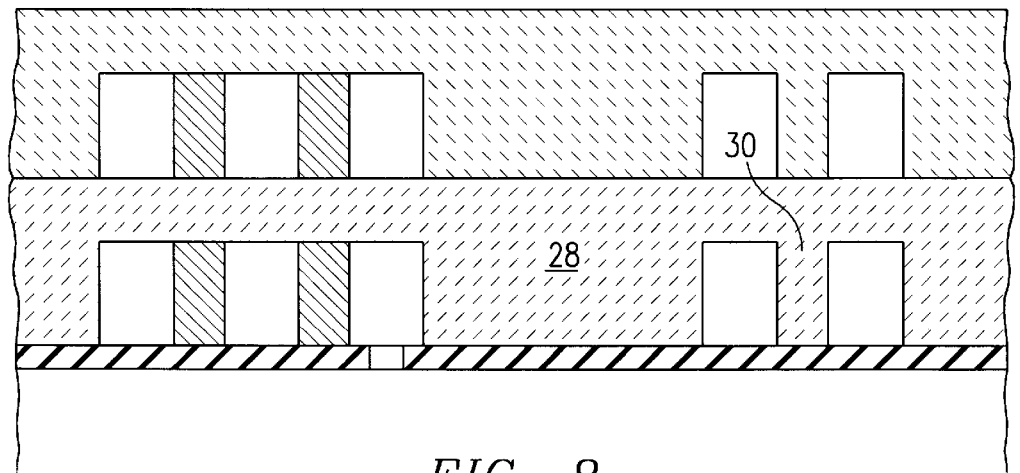
FIG. 8 Illustrates characteristics of alternative preferred embodiments—elimination of the liner layer, multiple levels, and minimum spaced leads without low dielectric constant material.

FIG. 8 illustrates characteristics discussed above as alternatives to the preferred embodiment shown in the sequence of FIGS. 1 through 7. FIG. 8 illustrates the optional liner layer 22 absent from a preferred embodiment of the present invention. Also illustrated in FIG. 8 are closely spaced interconnects 30 which are not separated by a low dielectric constant material. This is an example where closely spaced lines were determined to be non-critical areas due to design requirements, and therefore separation by low dielectric constant materials was not required. However, a limited amount of non-critical areas may also be filled with low dielectric materials to simplify the design or making processes. For example, all minimum spaced interconnects could be filled with low dielectric material regardless of criticality to simplify design rules. In addition, FIG. 8 also illustrates a multilevel embodiment as discussed above.

The sole Table, below, provides an overview of some embodiments and the drawings.

TABLE

| Drawing Element | Preferred or Specific Examples | Generic Term | Other Alternate Examples |
|---|---|---|---|
| 10 | Silicon Substrate | Substrate or Wafer | GaAs |
| 12 | Silicon Oxide | Buffer Layer | — |
| 14 | Aluminum | Interconnect Line | TiN/Al/TiN, Cu |
| 16 | Tungsten | Via | Aluminum |
| 18 | Silicon Oxide | Liner | — |
| 20 | Polymer | Low Dielectric Constant Material | Porous materials such as Aerogel and Xerogel, TEFLON, Polyimide, Fluorinated polyimide, Benzocyclobutene, Fluorinated benzocyclobutene. |
| 22 | Photoresist | Mask | — |
| 24 | SiO$_2$ | Inter-metal Dielectric | — |

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A microelectronic device structure comprising:
   (a) a substrate;
   (b) widely-spaced leads formed on said substrate, said widely-spaced leads spaced apart by more than one and one-half a minimum lead spacing;
   (c) closely spaced leads formed on said substrate, said closely-spaced leads having leads spaced apart less than or equal to one and one-half a minimum lead spacing;
   (d) a crack-prone low-dielectric material between at least some but not all of said closely-spaced leads of which portions are less than one and one-half the minimum lead spacing from another lead, said low-dielectric material providing a dielectric constant of less than 3 in a region between at least two of said metal leads; and
   (e) a structural dielectric layer formed of a second dielectric material over said low-dielectric material between said closely-spaced leads and over said substrate in areas not having metal leads and those closely spaced leads not having low-dielectric material between them.

2. The microelectronic structure of claim 1, also comprising a liner layer over said conductive interconnect lines and below said low dielectric constant material.

3. The microelectronic structure of claim 1, wherein said structural dielectric material is SiO$_2$.

4. The microelectronic structure of claim 1, wherein said structural dielectric layer comprises multiple layers of dielectric materials.

5. The microelectronic structure of claim 1, wherein said structural layer is planarized and further comprising one or more additional levels of interconnect metal above said interconnect lines.

6. The microelectronic structure of claim 1, wherein said liner layer material is selected from the group consisting of: siticon dioxide, and spin-on-glass.

7. The microelectronic structure of claim 1, wherein said low dielectric material is selected from the group consisting of: Polyimide; Polysilsesquioxane, Benzocyclobutene, Parylene N, Florinated polyimide, Parylene F, Polynaphthalene, Amorphous TEFLON, Polymer foams, Aerogel, Xerogel.

8. A microelectronic device structure comprising:
   (a) a substrate;
   (b) widely-spaced leads formed on said substrate, said widely-spaced leads spaced apart by more than one and one-half a minimum lead spacing;
   (c) closely spaced leads formed on said substrate, said closely-spaced leads having leads spaced apart less than or equal to one and one-half a minimum lead spacing;
   (d) a low-dielectric material having one or more poor mechanical properties between at least some but not all of said closely-spaced leads of which portions are less than one and one-half the minimum lead spacing from another lead, said low-dielectric material providing a dielectric constant of less than 3 in a region between at least two of said metal leads wherein said low dielectric material is selected from the group consisting of: Polyimide, Polysilsesquioxane, Benzocyclobutene, Parylene N, Florinated polyimide, Parylene F, Polynaphthalene, Amorphous TEFLON, Polymer foams, Aerogel, Xerogel; and
   (e) a structural dielectric layer formed of a second dielectric material over said low-dielectric material between said closely-spaced leads and over said substrate in areas not having metal leads and those closely spaced leads not having low-dielectric material between them.

9. The microelectronic structure of claim 8, also comprising a liner layer over said conductive interconnect lines and below said low dielectric constant material.

10. The microelectronic structure of claim 8, wherein said structural dielectric material is $SiO_2$.

11. The microelectronic structure of claim 8, wherein said structural dielectric layer comprises multiple layers of dielectric materials.

12. The microelectronic structure of claim 8, wherein said structural layer is planarized and further comprising one or more additional levels of interconnect metal above said interconnect lines.

13. The microelectronic structure of claim 8, wherein said liner layer material is selected from the group consisting of silicon dioxide, and spin-on-glass.

* * * * *